(12) United States Patent
Saba et al.

(10) Patent No.: US 12,242,784 B1
(45) Date of Patent: Mar. 4, 2025

(54) METHOD, PRODUCT, AND SYSTEM FOR A SEQUENCE GENERATION ECOSYSTEM USING MACHINE LEARNING

(71) Applicant: Cadence Design Systems, Inc., San Jose, CA (US)

(72) Inventors: Shadi Saba, San Jose, CA (US); Roque Alejandro Arcudia Hernandez, San Jose, CA (US); Uyen Huynh Ha Nguyen, San Jose, CA (US); Pedro Eugênio Rocha Medeiros, Serra-Belo Horizonte/MG (BR); Claire Liyan Ying, Los Altos Hills, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 672 days.

(21) Appl. No.: 17/490,378

(22) Filed: Sep. 30, 2021

(51) Int. Cl.
*G06F 30/333* (2020.01)
*G06N 5/022* (2023.01)

(52) U.S. Cl.
CPC .......... *G06F 30/333* (2020.01); *G06N 5/022* (2013.01)

(58) Field of Classification Search
CPC .. G06F 30/333; G06F 30/398; G06F 2111/04; G06F 2119/06; G06N 5/022; G06N 5/04; G06N 20/00; G06N 5/01
See application file for complete search history.

(56) References Cited

U.S. PATENT DOCUMENTS

| | | | |
|---|---|---|---|
| 10,318,412 B1 | 6/2019 | Mckearney et al. | |
| 10,586,014 B1 | 3/2020 | Kinderman et al. | |
| 10,902,169 B1 * | 1/2021 | George | G06F 30/30 |
| 11,144,693 B1 | 10/2021 | Ovadia | |
| 11,321,895 B2 | 5/2022 | Starke et al. | |
| 11,513,944 B1 | 11/2022 | Oguara et al. | |
| 11,548,146 B2 | 1/2023 | Sun | |
| 11,604,988 B2 | 3/2023 | Swett et al. | |
| 12,034,554 B2 * | 7/2024 | Mayfield | H04L 12/1831 |
| 2008/0234967 A1 | 9/2008 | Vandewiele et al. | |
| 2015/0302133 A1 | 10/2015 | Ikram et al. | |

(Continued)

OTHER PUBLICATIONS

Non-Final Office Action dated May 11, 2023 for related U.S. Appl. No. 17/490,496.

(Continued)

*Primary Examiner* — Nha T Nguyen
(74) *Attorney, Agent, or Firm* — Vista IP Law Group, LLP

(57) ABSTRACT

An approach is disclosed herein a sequence generation ecosystem using machine learning. The approach disclosed herein is a new approach to sequence generation in the context of validation that relies on machine learning to explore and identify ways to achieve different states. In particular, the approach divides the valid operations into different respective actions and action sequences. These actions are selected by machine learning models as they are being trained using online inference reinforcement learning. This online inference also is likely to result in the discovery of new states. Each state that has been identified is then used as a target to train a respective machine learning model. As part of this process a representation of all the states and actions or sequences of actions executed to reach those states is created. This representation, the respective machine learning models, or a combination thereof can then be used to generate different test sequences.

20 Claims, 11 Drawing Sheets

(56) References Cited

U.S. PATENT DOCUMENTS

| | | | |
|---|---|---|---|
| 2018/0025270 A1* | 1/2018 | John | G06N 20/00 |
| | | | 706/25 |
| 2018/0183728 A1* | 6/2018 | Kumar | H04L 45/124 |
| 2018/0253512 A1 | 9/2018 | Green | |
| 2019/0080258 A1 | 3/2019 | Eder et al. | |
| 2019/0250210 A1* | 8/2019 | Sun | G01R 31/31724 |
| 2019/0251219 A1* | 8/2019 | Behrend | G06F 30/3308 |
| 2019/0286546 A1 | 9/2019 | Johnston et al. | |
| 2020/0042434 A1* | 2/2020 | Albertson | G06V 10/82 |
| 2020/0104243 A1 | 4/2020 | Lee-smith | |
| 2020/0134131 A1 | 4/2020 | Tien et al. | |
| 2020/0234145 A1 | 7/2020 | Dai et al. | |
| 2020/0257840 A1* | 8/2020 | Huh | G06F 30/33 |
| 2020/0272548 A1* | 8/2020 | Carrington | G06F 11/261 |
| 2020/0311216 A1 | 10/2020 | Kumar et al. | |
| 2021/0103806 A1 | 4/2021 | Blaichman et al. | |
| 2021/0158162 A1 | 5/2021 | Hafner et al. | |
| 2021/0264085 A1* | 8/2021 | Green | G06N 3/045 |
| 2021/0287120 A1* | 9/2021 | Mamidi | G06N 5/01 |
| 2021/0390409 A1 | 12/2021 | Geist et al. | |
| 2023/0258718 A1 | 8/2023 | Tao et al. | |

OTHER PUBLICATIONS

Gogri (Stimulus optimization in hardware verification using machine-learning, May 2019) (Year: 2019).

Non-Final Office Action dated Feb. 14, 2023 for related U.S. Appl. No. 17/490,426.

Ioannides, C., et al., "Coverage Directed Test Generation automated by Machine Learning—A Review," ACM, copyright 2001.

Paduraru, C., et al., "An Automatic Test Data Generation Tool using Machine Learning," Proceedings of the 13th International Conference on Software Technologies (ICSOFT 2018), pp. 472-481, copyright 2018.

Shu, G., et al., "Testing Security Properties of Protocol Implementations—a Machine Learning Based Approach," 27th International Conference on Distributed Computing Systems, IEEE, copyright 2007.

Non-Final Office Action for U.S. Appl. No. 17/490,462 dated May 8, 2024.

Non-Final Office Action dated Nov. 2, 2023 for related U.S. Appl. No. 17/490,426.

Notice of Allowance dated Mar. 4, 2023 for related U.S. Appl. No. 17/490,426.

Final Office Action dated Jan. 5, 2024 for related U.S. Appl. No. 17/490,496.

Final Office Action dated Jul. 10, 2023 for related U.S. Appl. No. 17/490,426.

Notice of Allowance for U.S. Appl. No. 17/490,496 dated May 28, 2024.

Notice of Allowance for U.S. Appl. No. 17/490,462 dated Sep. 5, 2024.

* cited by examiner

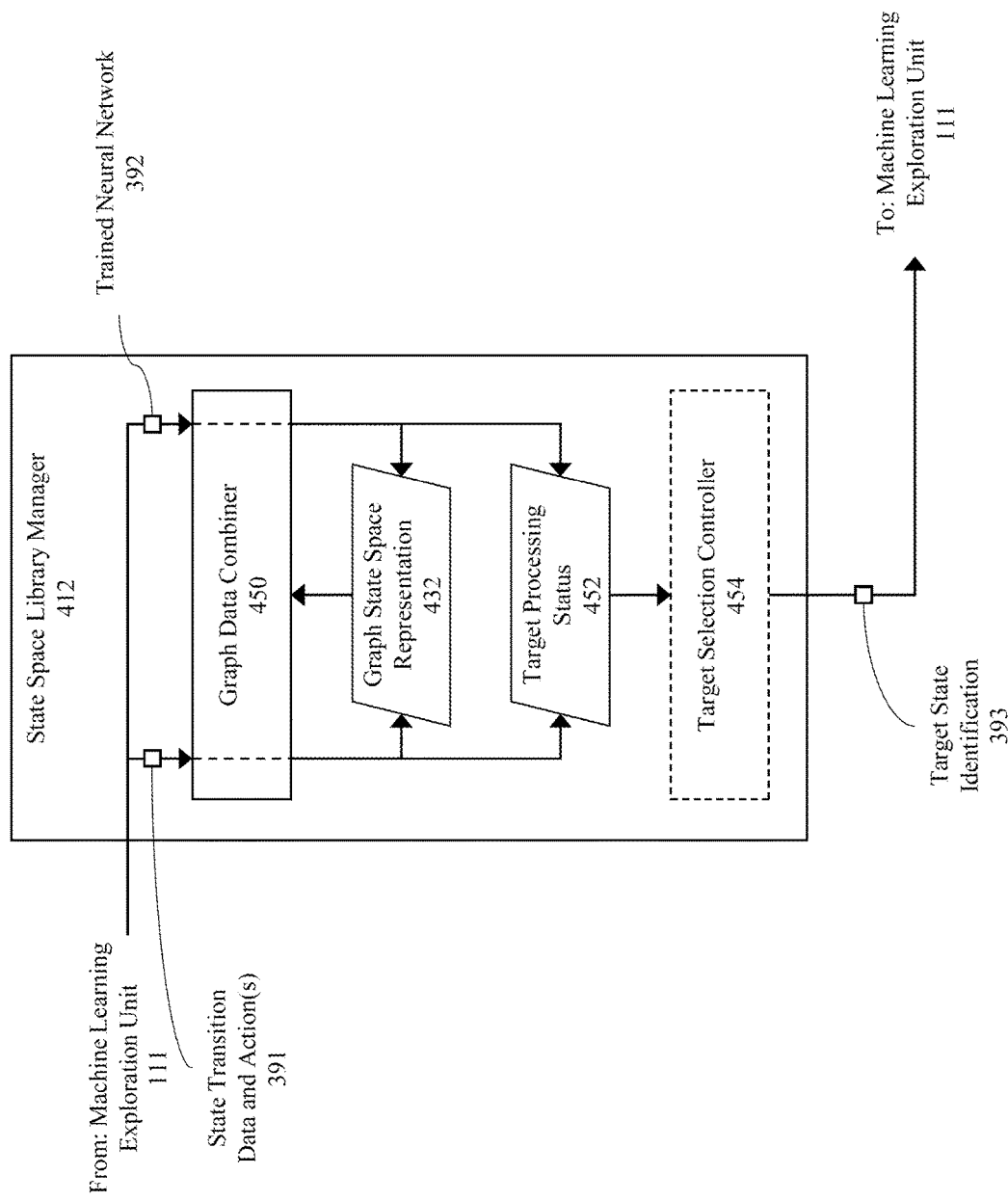

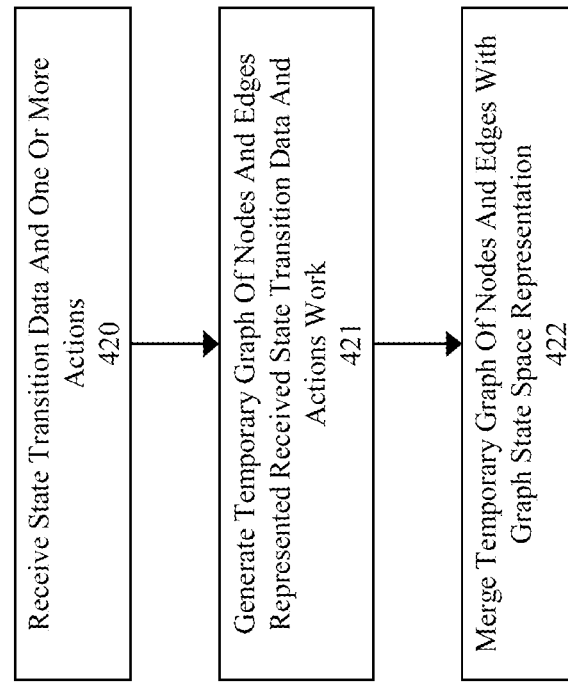
FIG. 4B1

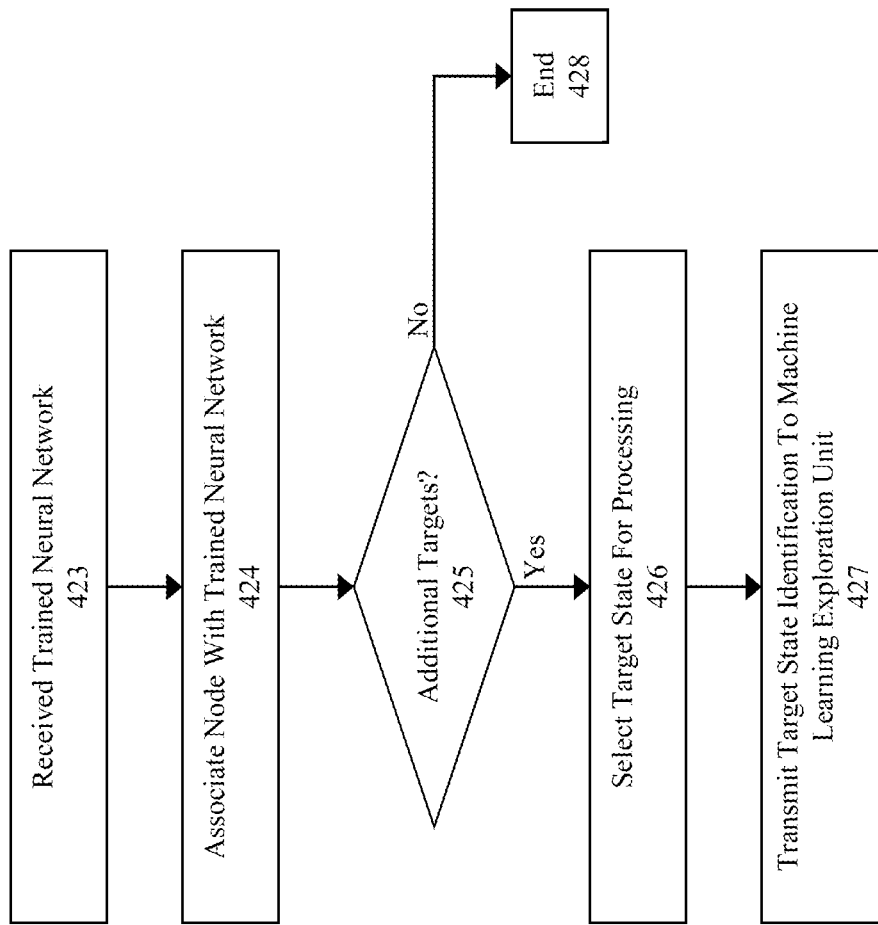
FIG. 4B2

METHOD, PRODUCT, AND SYSTEM FOR A SEQUENCE GENERATION ECOSYSTEM USING MACHINE LEARNING

RELATED APPLICATIONS

The present application is related to U.S. patent application Ser. No. 17/490,426 titled "METHOD, PRODUCT, AND SYSTEM FOR PROTOCOL STATE GRAPH NEURAL NETWORK EXPLORATION", filed on even date herewith and now issued as U.S. Pat. No. 12,038,477, which is hereby incorporated by reference in its entirety; U.S. patent application Ser. No. 17/490,462 titled "A METHOD, PRODUCT, AND SYSTEM FOR UNIVERSAL VERIFICATION METHODOLOGY (UVM) SEQUENCE SELECTION USING MACHINE LEARNING", filed on even date herewith and now issued as U.S. Pat. No. 12,141,512, which is hereby incorporated by reference in its entirety; and U.S. patent application Ser. No. 17/490,496 titled "A METHOD, PRODUCT, AND SYSTEM FOR RAPID SEQUENCE CLASSIFICATION THROUGH A COVERAGE MODEL", filed on even date herewith and now issued as U.S. Pat. No. 12,099,791, which is hereby incorporated by reference in its entirety.

FIELD

The present invention is directed to approaches for sequence generation for design verification.

BACKGROUND

Integrated circuits are constructed from multiple layers of metal and other materials that are placed on a substrate. For example, power and ground are distributed to different circuit elements using multiple different metal layers, vias, routing paths, and planes. Capacitors and transistors are created from various combinations of conducting, semiconducting, and insulating layers. The process of placing these elements (e.g., via deposition) creates these layers one on top of the other. Not only is this manufacturer of semiconductor devices very expensive, a lot of work that goes into designing the semiconductors devices including RTL or gate level circuit design. To avoid wasted efforts from manufacturing products that do not work as intended there are usually a number of verifications steps implemented during the design of an integrated circuit.

Verification can be performed to verify whether a design meets a functional description, is compliant with one or more protocols, or does not violate any layout rules. For example, verification can be implemented based on a hardware description language (e.g., VHDL or Verilog), at the circuit schematic level (e.g., RTL—register transistor level), or at the layout level.

Unfortunately, verification also takes time to complete. For example, before verification can be completed the actual test sequences need to be generated. Once the test sequences are generated those tests need to be performed. Furthermore, test verification is currently a human controlled process with tests being generated at random, manually, or using some combination thereof. This can result in errors or omissions such as failure to test for each and every corner case.

Thus, what is needed is an improved method, product, and system that avoids the issues associated with current techniques.

SUMMARY

Embodiments of the present invention provide an approach for a method, product, and system for a sequence generation ecosystem using machine learning.

Disclosed herein is a new approach to sequence generation in the context of validation that relies on machine learning to explore and identify ways to achieve different states. In particular, the approach divides the valid operations into different respective actions and action sequences. These actions are selected by machine learning models as they are being trained using online inference. This online inference also is likely to result in the discovery of not yet discovered states. Each state that has been identified is then used as a target to train a respective machine learning model. As part of this process a representation of all the states and actions or sequences of actions executed to reach those states is created. This representation, the respective machine learning models, or a combination thereof can then be used to generate different test sequences. This frees the user from manually creating such sequences and helps avoid human error.

Other additional objects, features, and advantages of the invention are described in the detailed description, figures, and claims.

BRIEF DESCRIPTION OF FIGURES

In order that the present invention is better understood, some embodiments of the invention will now be described, by way of example only, with reference to the accompanying drawings.

FIG. 4A illustrates an example arrangement for a state space library manager according to some embodiments.

FIG. 4B1 illustrates an example flow corresponding to the state space library manager arrangement for a state space library manager according to some embodiments.

FIG. 4B2 illustrates an example of flow control operations corresponding to receipt of a trained neural network at the state space library manager according to some embodiments.

DETAILED DESCRIPTION

Embodiments of the present invention provide an approach for a method, product, and system for a sequence generation ecosystem using machine learning.

Various embodiments are described hereinafter with reference to the figures. It should be noted that the figures are not necessarily drawn to scale. It should also be noted that the figures are only intended to facilitate the description of the embodiments and are not intended as an exhaustive description of the invention or as a limitation on the scope of the invention. In addition, an illustrated embodiment need not have all the aspects or advantages shown. An aspect or advantage described in conjunction with a particular embodiment is not necessarily limited to that embodiment and can be practiced in any other embodiments even if not so illustrated.

Figure 1A:
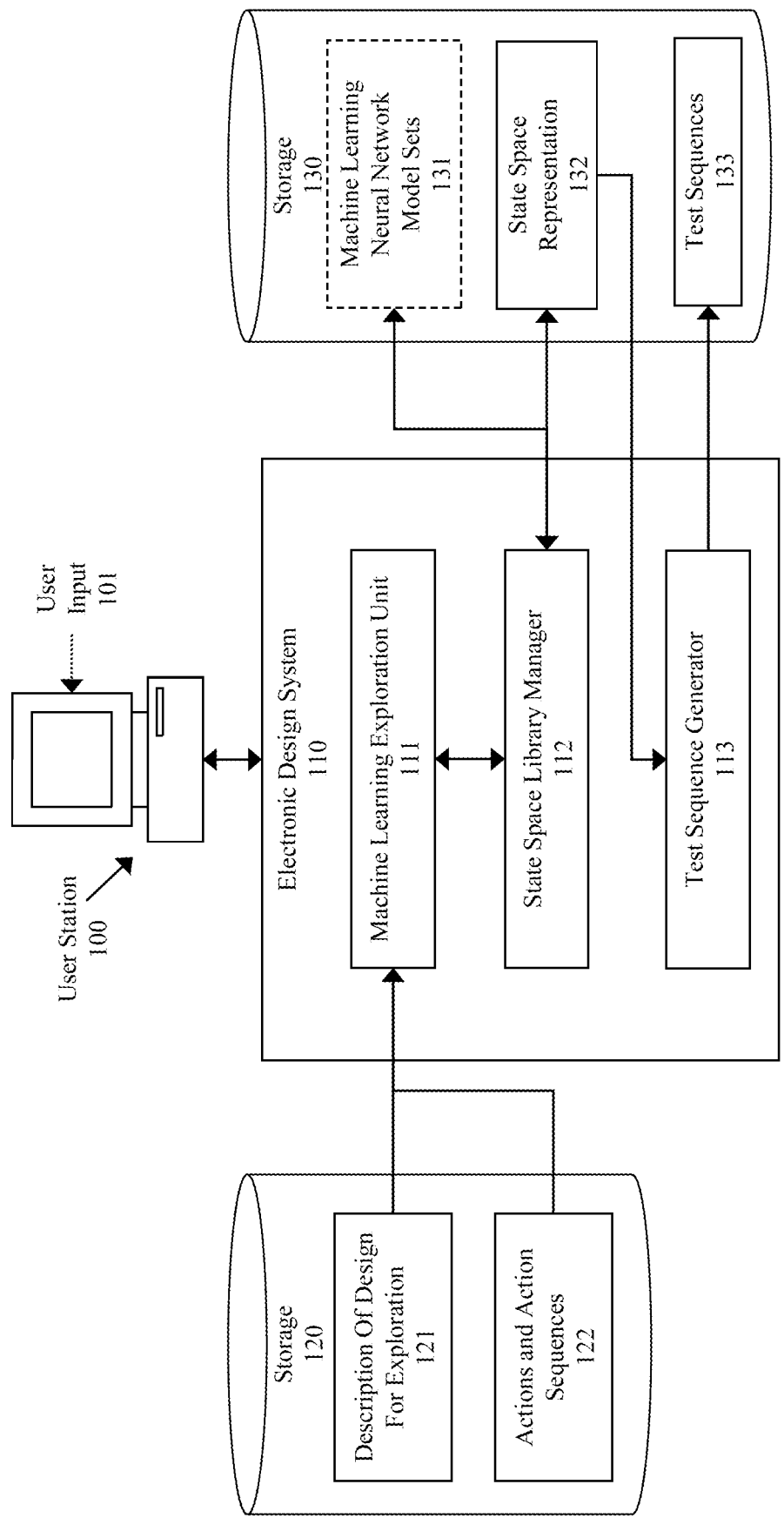
FIGS. 1A-1B illustrate example arrangements for a sequence generation ecosystem using machine learning according to some embodiments.
Figure 1B:
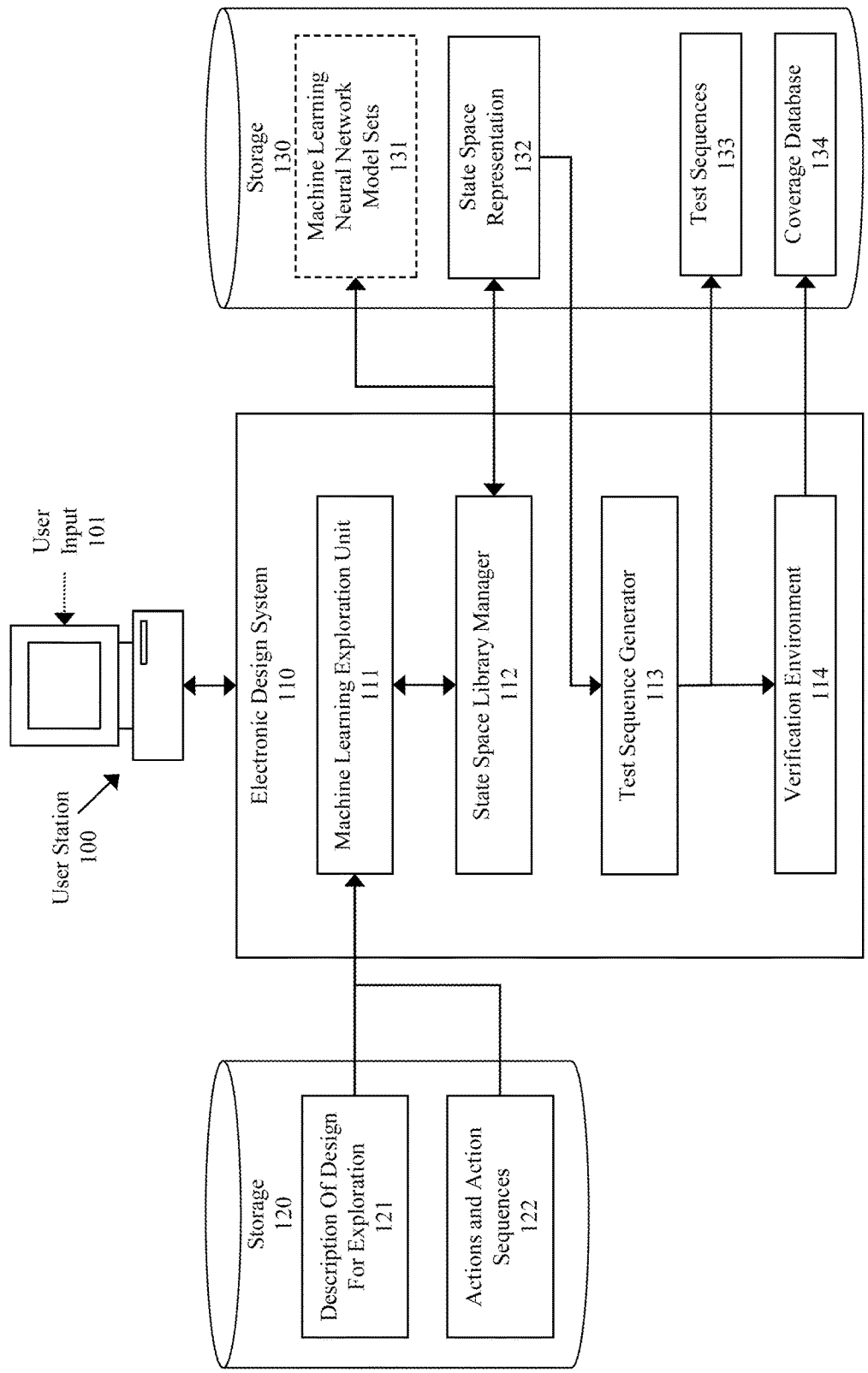

FIGS. 1A-1B illustrate example arrangements for a sequence generation ecosystem using machine learning according to some embodiments. Generally, the ecosystem comprises a set of components for implementing a machine learning process and capturing knowledge about the states discovered and how those states were discovered. This information can then be used to generate test sequences as will be discussed. Additionally, in some embodiments the aspects are integrated with or within a verification environment.

FIG. 1A illustrates an example arrangement for a sequence generation ecosystem using machine learning according to some embodiments without including the verification environment.

The sequence generation ecosystem illustrated in FIG. 1A includes a user station 100, an electronic design system 110, a first storage 120 and a second storage 130. In some embodiments, the different portions are maintained separately. In some embodiments, different combinations of the portions illustrated may be combined or separated into any permutation.

In some embodiments, the user station 100 includes or provides access to the electronic design system 110 and controls the processes of the electronic design system 110 at least with regard to a portion or the whole of the subsets illustrated therein. For instance, the electronic design system 110 might be located on the user station 100, on a remote device accessed by the user station, or distributed across multiple devices. The user station 100 causes the execution of a process to discover and collect data into a state space representation regarding different states and ways to get to those different states, which may be used to generate one or more test sequences. In some embodiments, the collected data includes or corresponds to the trained machine learning models which may also be used to generate test sequences.

The user station 100 comprises any type of computing station that is useable to operate or interface the electronic design system and optionally with a storage (e.g., 120 and/or 130). Examples of such user stations include workstations, personal computers, or remote computing terminals. In some embodiments, the user station 100 comprises a display device, such as a display monitor, for displaying a user interface to any users at the user station. The user station 100 also comprises one or more input devices for the user to provide operational control over the user station, such as a mouse or keyboard to manipulate a pointing object in a graphical user interface from which a user input 101 might be received.

The electronic design system 110, as illustrated, includes a machine learning exploration unit 111, a state space library manager 112, and a test sequence generator 113. In some embodiments, the electronic design system 110 includes one or more application programming interfaces for interfacing with the user station 100, storage 120, storage 130 or some combination thereof.

The machine learning exploration unit 111 generally controls machine learning models and training thereof to select one or more actions or action sequences to be executed against a description of a design (see e.g., description of design for exploration). For example, the machine learning exploration unit might instantiate a machine learning model for each of a set of respective target states. Thus, for a first state, a first machine learning model might be executed to achieve a first target state. A number of training iterations might be implemented either until a maximum number of iterations is reached, or until training closure occurs. In some embodiments, the machine learning model operations are implemented on a hardware acceleration device for machine learning. To achieve the desired target, the machine learning model selects one or more actions or action sequences from a data set (e.g., actions and action sequences 122) to be performed based on a set of current state variables. For example, a set of state variables could be mapped to inputs to a machine learning model and set of actions or action sequences could be mapped to the output(s) of the machine learning model. In some embodiments, the machine learning model operates on the design under test using online inference. In some embodiments, a rewards system is used to train machine learning models. For instance, a reward of 0.001 could be used to encourage discovery of new states, or a reward of 1 could be used when the desired state is achieved. Each machine learning model generated by the machine learning exploration unit might be output to a state space library manager for later use. In addition, each time an action or sequence of actions is applied to a design under exploration a set of state variables might be collected. Generally, these state variables, machine learning models, or both are output to a state space library. In some embodiments, the state variables, machine learning models, or both are stored in a storage space (see e.g., storage 130 having machine learning neural network model sets 131 and state space representations 132).

The state space library manager 112 collects information garnered from the machine learning exploration unit for corresponding designs. For example, the state space library manager maintains data representing each state (as corresponding to a set of variables and their associated unique combination of values), and corresponding actions that were taken to achieve that state. For example, a state space representation (see e.g., 132) might comprise a graph of nodes and edges where the nodes represent states and edges represent changes from one state to another state. In some embodiments, a plurality of states are associated with respective trained machine learning models.

The test sequence generator 113 operates on the output from the state space library manager to generate one or more test sequences. For example, the test sequence generator might generate one or more sets of actions or action sequences to execute to achieve each target state which is stored in test sequences 133. In some embodiment the test sequence generator processes the generated test sequences to pair the number of operations down. For example, test sequences that overlap with other test sequences might be pruned from the set of test sequences. In this way, duplicate operations can be minimized, and thus the time that a set of test sequences take to execute might be decreased. In some embodiments, the test sequences comprise the smallest number of actions needed to achieve a target state which might be identified by traversing a graph of nodes and edges to find a shortest path (see e.g., state space representation 132). In some embodiments, the machine learning neural network model sets corresponding to a design being analyzed is used to select the action as needed (see e.g., machine learning neural network model sets 131).

Storage 120 includes a description of a design for exploration 121 (e.g., RTL level description of the design) and actions and action sequences 122 (e.g., commands or command sequences to be executed at the simulated design). The data is usable for exploration and testing purposes. For example, a design from 121 might be loaded into a simulation module in the machine learning exploration unit 111, where the machine learning exploration unit 111 then uses respective machine learning models to select respective actions or action sequences to achieve a respective state.

The storage 130 includes a state space representation 132 and test sequences 133. In some embodiments, the storage 130 includes machine learning neural network model sets 131 either in addition to or instead of the state space representation 132. The state space representation 132 comprises a representation of states of the device and actions that were used to reach those states. The states themselves are defined by a set of variables that are relevant to the design under test. The machine learning neural network model sets 131 comprise a plurality of machine learning models where each model is trained to reach a target state by selecting one or more actions or action sequences. The test sequence 133 comprises one or more test sequences that are generated based on analysis of the state space representation 132, the machine learning neural network models 131 or a combination thereof.

FIG. 1B illustrates an example arrangement for a sequence generation ecosystem using machine learning according to some embodiments and includes a verification environment. In particular, the embodiment of FIG. 1B adds a verification environment 114 to the electronic design system 110 and a coverage database 134 to storage 130.

The verification environment 114 includes a testing environment where some or all test sequences are executed against a design. For example, a set of test sequences are executed and verification is performed to determine whether the expected behavior occurred, e.g., state changes, read, write, output, or other operations. In some embodiment, the verification environment can process a set of test sequences to determine the coverage of those test sequences. In some embodiments, multiple different sets of test sequences can be analyzed to determine the cover for different functional behavior (e.g., protocols). The coverage information can then be stored in a coverage database 134 for presentation to a user at request.

Figure 2:
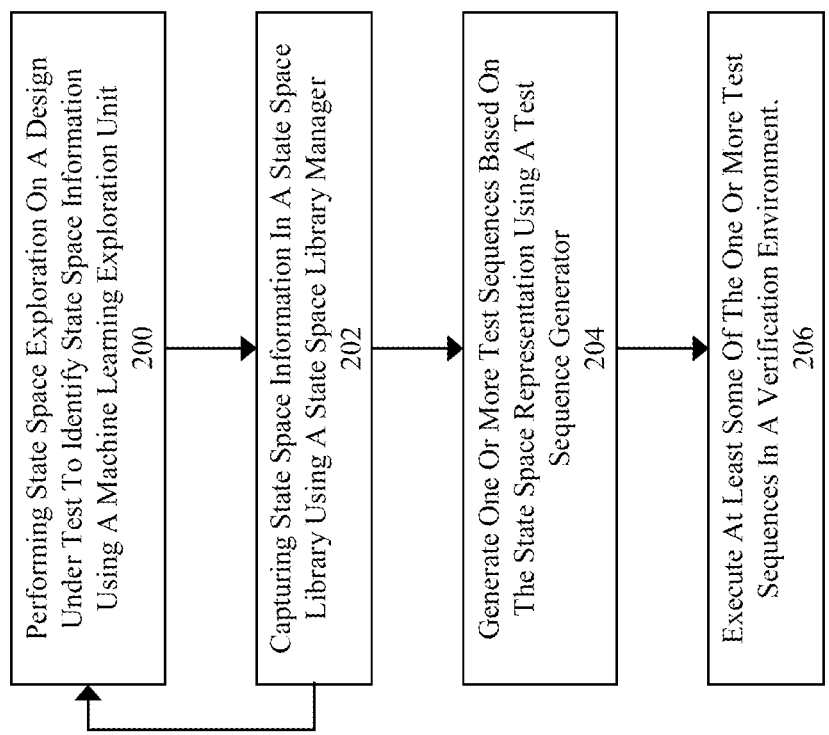
FIG. 2 illustrates a flow for a sequence generation ecosystem using machine learning according to some embodiments.

FIG. 2 illustrates a flow for a sequence generation ecosystem using machine learning according to some embodiments. The flow illustrates one possible flow that might be implemented by the sequence generation ecosystem according to some embodiments.

The process generally starts at 200 where a design under test is explored to identify state space information using a machine learning state space exploration unit. As previously discussed, this process is guided by different machine learning models. For example, a first machine learning model might be trained to achieve a target state. That target state might be a state chosen at random that may not even exist or a state selected from a set of known existing states (e.g., from a state library). However, as the machine learning model will cause the execution of different actions or action sequences it will also cause the identification of new states of the design. However, because an initial model might be trained to achieve a non-existent state that model might be subject to an iteration limit. Subsequently, machine learning models are trained to achieve different respective target states. As this happens more states might be identified, and individual models of the machine learning models might achieve closure.

At 202 any state space information is captured in a state space library using a state space library manager. The state space library manager processes data that indicates the states that different respective machine learning models caused the design under test to achieve. This information might comprise parameters of the design and might correspond to or be associated with the actions or sequence of actions that were taken to reach those states, such that each state captured can be recreated by executing at least those same actions or sequence of actions. This process might capture the discovery of states that were not previously known. Thus, those states might be fed back to the state space exploration such as via a target state to be associated with a machine learning model trained to achieve that state.

At 204 one or more test sequences are generated by a test sequence generator based on the state space representation. For example, the state space representation could be analyzed to determine the minimum number of actions required to achieve each state. That minimum number of actions might be combined into a set of test sequences. In some embodiments, the set of test sequences might be further processed to decrease the number of actions that need to be taken to execute those test sequences while maintaining the same coverage. For instance, where one state requires passing through another state, the set of actions might be pruned such that the one state and the other state are tested using at least in part the same actions or sequence of actions.

In some embodiments, at least one or more test sequences of the set of test sequences in a verification environment at 206. For example, a design under test might be instantiated within a simulation environment and stimulated with the same at least one or more test sequences. In this way the machine learning models can be used to generate validation tests for a design under test.

Figure 3A:
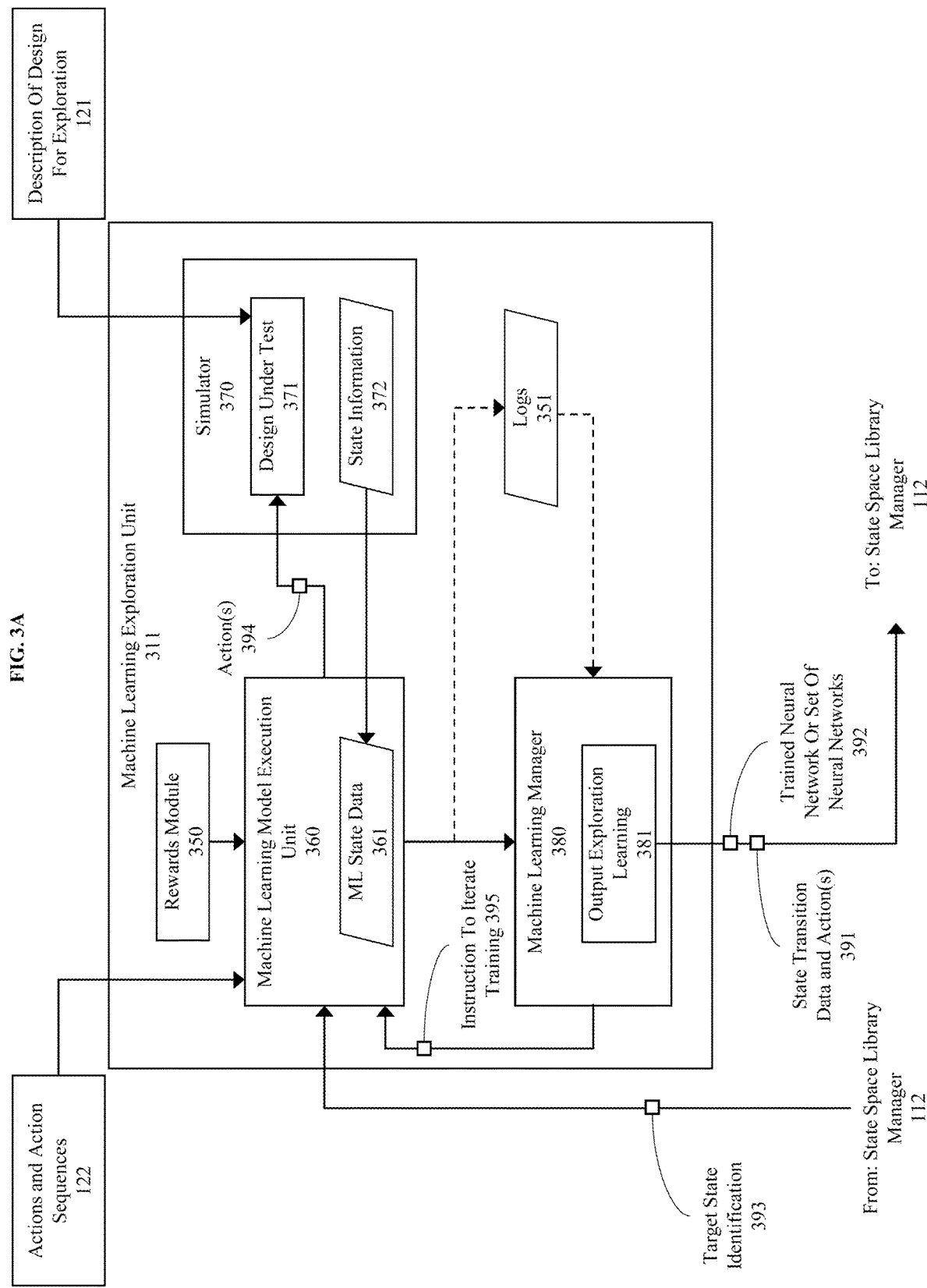
FIG. 3A illustrates an example arrangement for a machine learning exploration unit according to some embodiments.

FIG. 3A illustrates an example arrangement for a machine learning exploration unit according to some embodiments. The machine learning exploration unit generally comprises a machine learning manager that can instantiate a machine learning model that selects one or more actions or action sequences to be executed on a design under test. The machine learning manager can also analyze those actions or action sequences and corresponding state information to generate outputs representing different states identified and the actions or action sequences that were taken to achieve those states.

The machine learning exploration unit 311 as illustrated includes a rewards module 350, a machine learning model execution unit 360, a simulator 370, and a machine learning manager 380. In some embodiments, the machine learning exploration unit includes logs 351.

The machine learning model execution unit 350 may include a trained or untrained machine learning model. The machine learning model might be initially instantiated with random or preset values and having an initial state (e.g., ML state data 361). The machine learning model might have mapped parameters to be retrieved from a simulator or design under test to one or more actions or a sequence of actions. The actions or sequences of actions might be provided from a resource separate from the machine learning exploration unit 311 (see. e.g., actions and action sequences 122). When, the machine learning model selects one or more actions or a sequence of actions they are transmitted (either directly or indirectly—e.g., by reference) to the simulator 370 (see action(s) 394) to be executed at the design under test 371.

The training of the machine learning model is further implemented using a rewards module. As suggested by the name, the rewards module is used to encourage a movement made by the machine learning model. For example, a reward might be given when the machine learning model causes the discovery of a new state (or merely a change in state) or when a target state is reached. The reward for reaching a new state might smaller than a reward that is given when a target state is reached (e.g., 0.001 for a new state, and 1.0 for reaching the target state). Additionally, a negative reward might be provided when a reset state is applied (e.g., −1.0) to avoid the machine learning model from selecting actions that might loop or otherwise result in repeatedly achieving the same state.

The simulator 370 includes the design under test 371 (from 121) and state information 372. As previously discussed, the design under test is retrieved from a description of the design for exploration. The state information 372 describes the current state of the design under test and possibly state information from the simulator. For example, if the design under test is a state machine, the state information might identify which state the design is in. The state information might also specify whether the current state has changed from a previous state, whether the state is a reset state, or whether the state is an undefined or error state.

The machine learning manager 380 generally controls the execution of the machine learning model. For example, the machine learning manager might control the interactions that a particular machine learning model might execute and a maximum number of iteration that a machine learning model is allowed attempt during the training process. Additionally, the machine learning manager might control the instantiation of a new machine learning model to be trained and the selection of a target for that new machine learning model to be trained on. In this way, the machine learning manager 380 can control how each of multiple machine learning models are trained and what they are trained to achieve for any particular design under test. Another aspect of the machine learning manager is the output of exploration learning at 381. For example, the output of exploration learning might be first received either directly from the machine learning model processes or from a log (see 351) that captures the state changes and the actions or action sequences that were executed to achieve that state. This captured state and action data is then transmitted to a state space library manager 112 see e.g., 391). Additionally, a representation of respective trained machine learning models might be transmitted to the state space manager 112 to be associated with a corresponding target state (see 392). Finally, the state space manager may also control the instantiation and training of additional machine learning models using a target state identification (see e.g., target state identification 393 from state space manager 112). Once a machine learning model has been trained to achieve a particular state or has reached an iteration limit, the machine learning manager might instantiate a new machine learning model instance to be trained or reach a new target state.

Figure 3B:
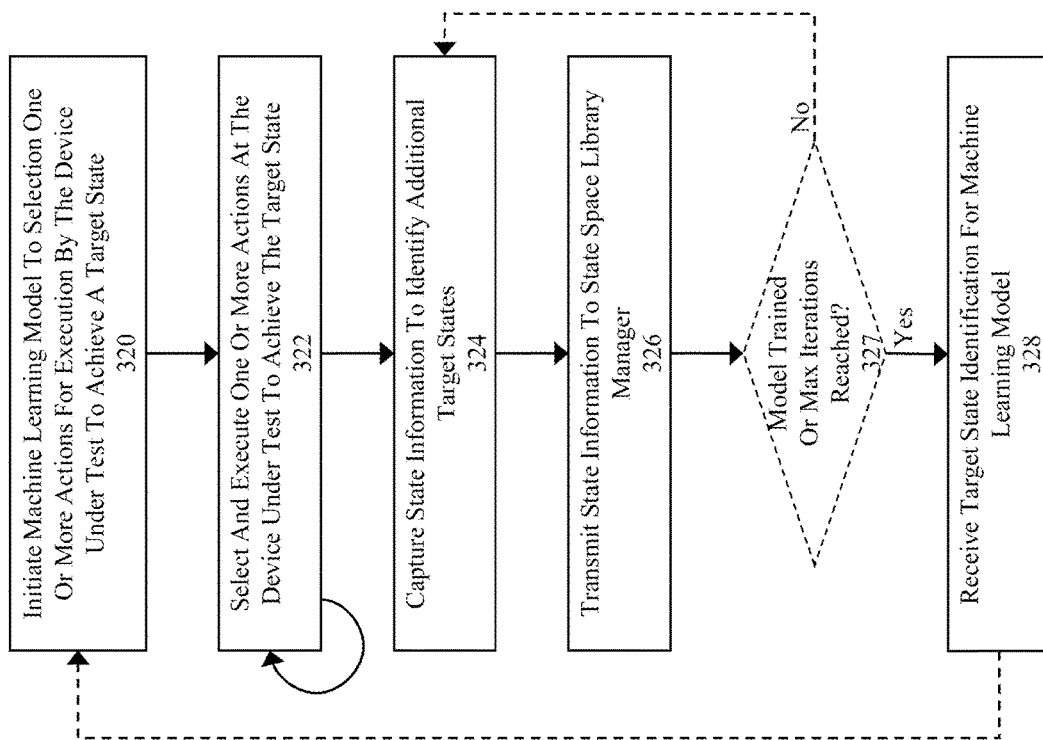
FIG. 3B illustrates an example flow corresponding to an arrangement for a machine learning exploration unit according to some embodiments.

FIG. 3B illustrates an example flow corresponding to an arrangement for a machine learning exploration unit according to some embodiments.

The process generally starts at 320 where a machine learning model is instantiated to select one or more actions or a sequence of actions to be executed by the device under test to achieve a target state. Generally, this comprises mapping one or state parameters from the design under test to inputs of the machine learning model and mapping one or more outputs from the machine learning model to one or more actions or sequences of actions.

After the machine learning model is instantiated, the model is used to select one or more actions or a sequence of actions at 322. This is an interactive process in that the machine learning model can be iterated multiple times. In some embodiments, the machine learning model may achieve a training closure within a permitted number of iterations. In some embodiments, a respective machine learning model might not achieve training closure before an iteration limit is reached. In some embodiments, a replacement machine learning model might be instantiated with different initial values be for multiple iterations are executed to train the replacement model. In some embodiments, the a replacement machine learning model is instantiated with a greater number of iterations allowed. In some embodiments, the design under test is reset after each of the one or more actions or the sequence of actions is executed—e.g., before any additional selection of actions is made the design under test is reset.

As the machine learning model is iterated and the corresponding actions are executed, different state information is identified. This information is captured at 324 to identify the states of the device under test and the way in which those states were achieved. For example, after before and after each action or sequence of actions are executed, various state information parameters are captured alone. Additionally, the action or sequence of actions that caused the state change are captured. Once captured, the state information parameters and the actions or sequences of actions are transferred to the state space library manager for merging with previously identified state information parameters and the actions or sequences of actions at 326. In some embodiments, information corresponding to each respective state change is collected and transmitted as it occurs. In some embodiments, all state information corresponding to each respective state change is collected and transmitted once the machine learning model has completed training or reached an iteration limit. If the state information is transmitted as it is identified, the flow illustrated here might include a determination at 327 as to whether the model is trained, or an iteration limit has been reached. If not, the process returns to 324.

If the machine learning model is trained or has reached an iteration limit, the process proceeds to 328 where processing is performed to receive and possibly select a target state identification for another machine learning model to be trained when there are additional targets that have not yet been processed as discussed above.

FIG. 4A illustrates an example arrangement for a state space library manager according to some embodiments. Generally, the approach illustrated here implements the state space library as a graph of nodes and edges where new data is merged with the existing state space library.

As illustrated here, the state space library manager 412 includes a graph data combiner 450 that operates on the state space library. In some embodiments, the state space library manager 412 includes a target selection controller 454.

The graph data combiner 450 receives state transition data and one or more actions 391 and trained neural networks 392 (machine learning models) from the machine learning exploration unit 111. With regard to the state transition data and one or more actions 391, the graph data combiner merges the received data with the graph state space representation 432. This might be accomplished by generating a temporary graph of nodes and edges representing the state transition data and one or more actions 391, where each node corresponds to a state and each edge connects two nodes and is annotated with one or more actions or action sequences that were taken to cause the state transition. In some embodiments, each temporary graph of nodes and edges represent a single transition from one state to another state using at least one action or action sequence. In some embodiments, each temporary graph of nodes and edges represents multiple transitions (e.g., all transitions identified due to one or more actions or action sequences). Once generated the temporary graph of nodes and edges is merged with the existing graph state space representation 432. Approaches to accomplishing this are discussed below in regard to FIG. 4B1. In some embodiments, the graph state space representation 432 is annotated to associate the trained neural network 392 to a corresponding node in the network (e.g., a reference to a trained neural network is added for each node for which that trained neural network was trained to reach). In some embodiments, target processing status 452 data is maintained that identifies the status of each node within the graph state space representation (e.g., processed completed, process failed, processing pending, processing in progress).

In some embodiments, a target selection controller 454 is also provided. The target selection controller can analyze the target processing state 452 to select a target to analyze and to generate a target state identification 393. The target state identification 393 may then be transmitted to the machine learning exploration unit 111.

FIG. 4B1 illustrates an example flow corresponding to the state space library manager arrangement for a state space library manager according to some embodiments.

The process starts at 420 where state transition data and one or more actions are received. In some embodiments, the state transition data and one or more actions are processed by generating a temporary graph of nodes and edges. The nodes in the temporary graph represent respective states and the edges represent transitions from one state to another. The edges are also annotated to represent the corresponding one or more actions or sequence of actions that were taken to transition the state.

The temporary graph of nodes and edges is merged with the graph state space representation at 422. One approach to accomplishing this is to identify each node in turn and match each node to an existing node in the graph state space representation where possible and where no match exists to generate a new node. Once all the nodes are accounted for the edges in the temporary graph are processed. For instance, for each edge, a determination is made as to whether a corresponding edge already exists. If there is a corresponding edge, that edge is then processed to determine if the corresponding edge is associated with a different action or sequence of actions. If an action or sequence of actions is not already reflected in the graph state space representation, then an additional entry is created for the edge to represent those actions. If the edge is new, then the edge is first created to connect the correct nodes and then annotated with the information from the temporary graph of nodes and edges. In some embodiments, the edges are directional where the edges capture from which node and to which node a corresponding state change occurred.

FIG. 4B2 illustrates an example of flow control operations corresponding to receipt of a trained neural network at the state space library manager according to some embodiments.

At 423 a trained neural network (trained machine learning model) is received. For instance, the trained neural network is received from the machine learning exploration unit. The machine learning model might be represented in any way as is known. Once received the trained neural network is associated with the node which the trained neural network was trained to reach via the one or more actions or sequence of actions at 424—e.g., by placing a pointer or identifier of the trained neural network in the node as maintained in the graph state space representation 432 or storing the trained neural network in the graph state space representation in the node itself.

In some embodiments, a determination is made at 425 as to whether there are additional targets to be processed. If there are no additional targets the process ends at 428. However, if there are any remaining targets to be process a target state is selected for processing at 426 and a target state identification is transmitted to the machine learning exploration unit at 427.

Figure 5:
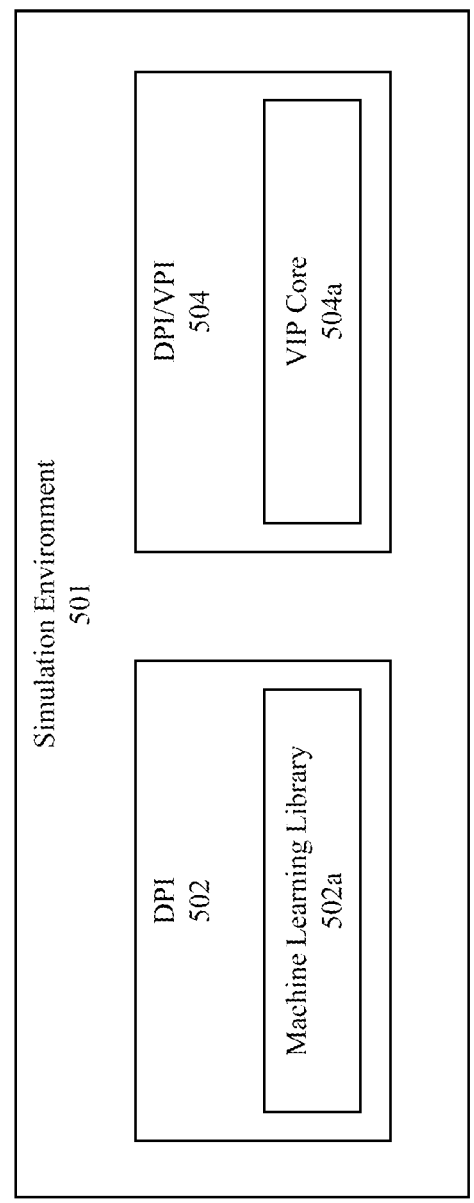
FIG. 5 illustrates an example approach to integrate techniques disclosed herein into a simulation environment according to some embodiments.

FIG. 5 illustrates an example approach to integrate techniques disclosed herein into a simulation environment according to some embodiments.

The simulation environment is illustrated at 501 in the form of a universal verification model, having a direct programming interface (DPI) 502 and a direct programming interface or a Verilog programming interface (VPI) 504. The DPI 502 on the left includes a machine learning library 502a that is usable to interface to the machine learning aspects discussed herein. The DPI/VPI 504 includes a verification IP core (VIP) 504a that is usable to interface with the description of the design under test. In this way the machine learning models and the design can be linked.

Figure 6:
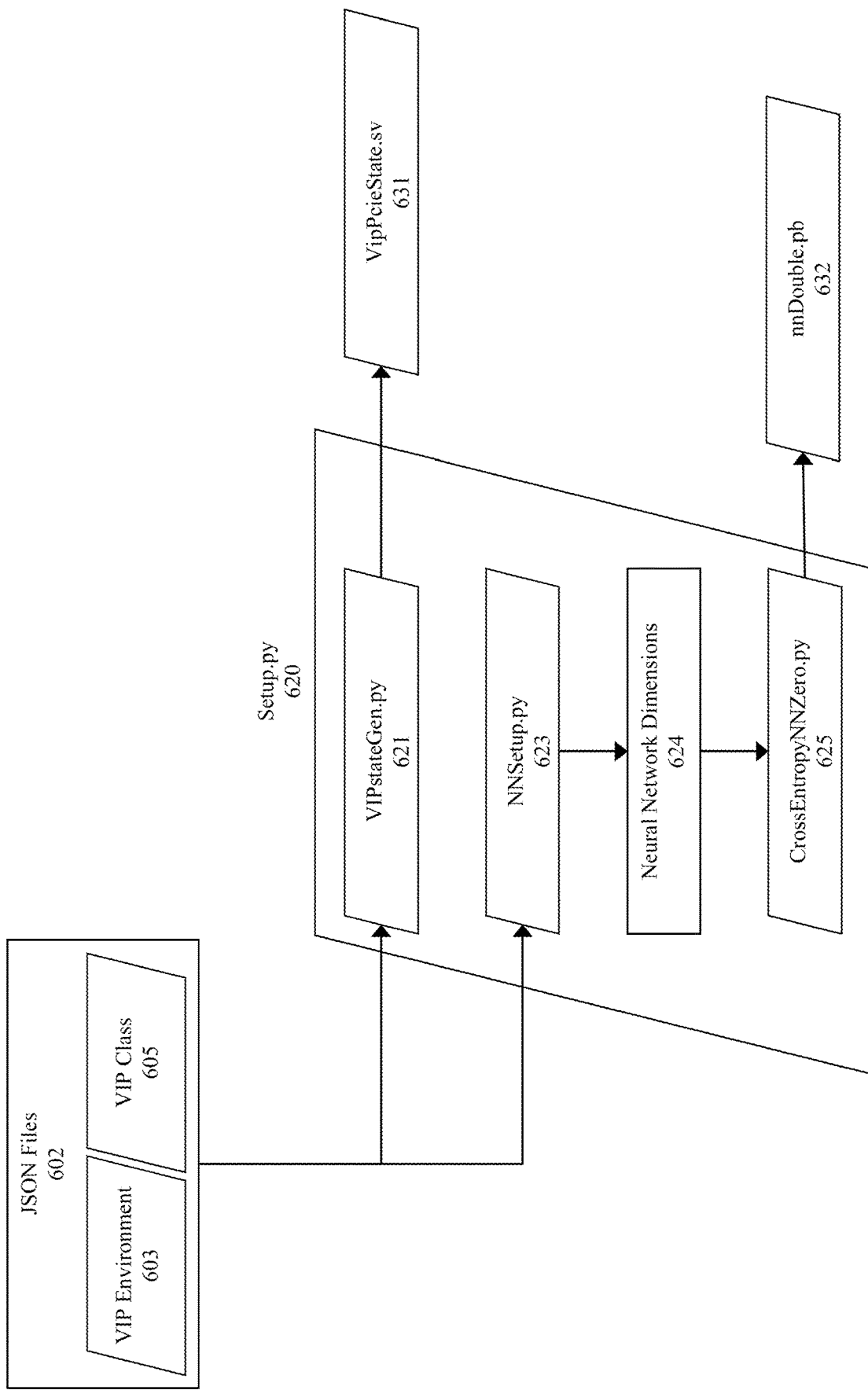
FIG. 6 illustrates an example approach to maintain a setup script according to some embodiments.

FIG. 6 illustrates an example approach to maintain a setup script according to some embodiments. Generally, the setup scripts define the parameters of the design under test and the machine learning model.

The JSON files 602 include the Verification IP environment JSON file 603 and the Verification IP class JSON file 605. The VIP environment JSON file 603 defines the field for each instance of the machine learning model that is to be generated. The VIP class JSON file 605 defines the type of the machine learning models fields and maps them to inputs for the machine learning model. In some embodiments, the inputs for the machine learning model are mapped to registers within a verification IP model.

The JSON files 602 are used as input to the VIPstategen.py 621 in setup.py 620 to generate an SV class containing the model's states (see e.g., VipPcieState.sv 631). NNSetup.py 623 gets the neural network dimension (see 624) from the JSON files 602, which are then applied by CrossEntropyNNZero.py to generate a graph definition with weights (see e.g., nnDouble.pb 632).

System Architecture Overview

Figure 7:
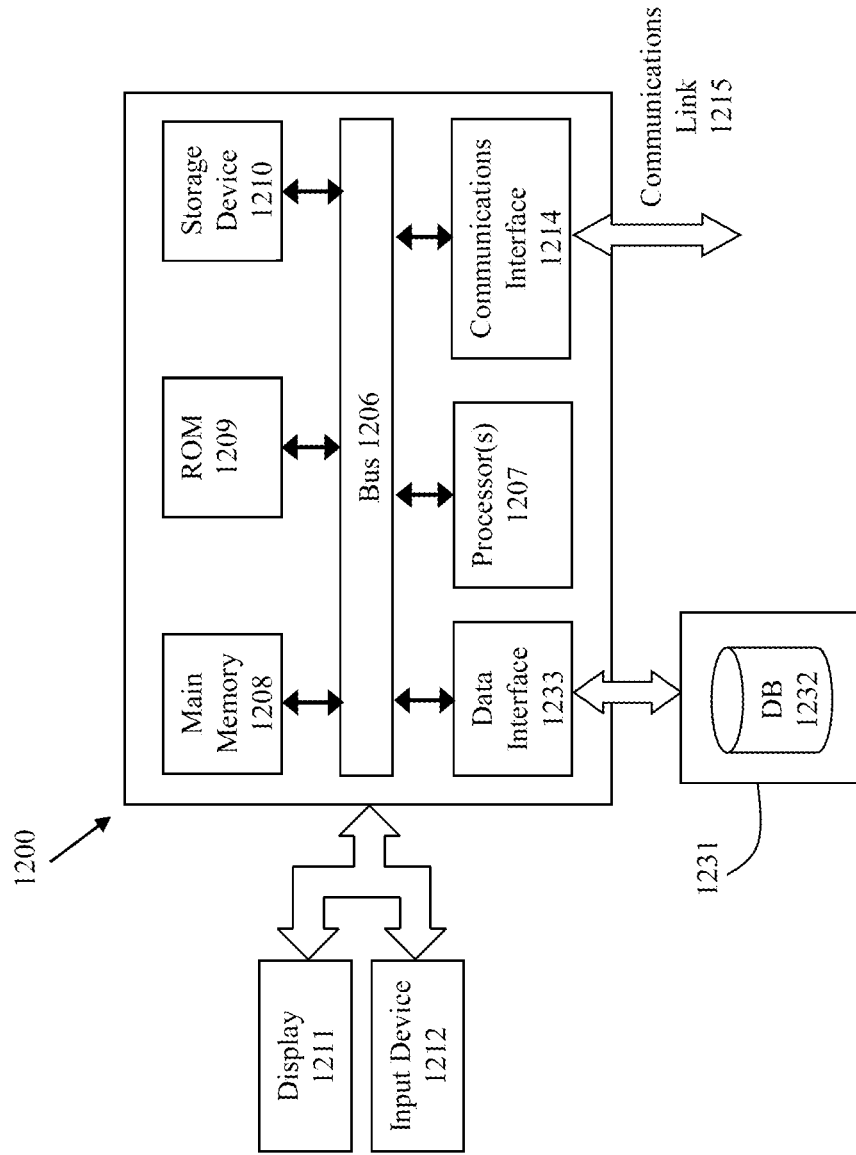
FIG. 7 shows an architecture of an example computing system with which the invention or parts of the invention may be implemented.

FIG. 7 shows an architecture of an example computing system with which the invention may be implemented. Computer system 1200 includes a bus 1206 or other communication mechanism for communicating information, which interconnects subsystems and devices, such as processor 1207, system memory 1208 (e.g., RAM), static storage device 1209 (e.g., ROM), disk drive 1210 (e.g., magnetic or optical), communication interface 1214 (e.g., modem or Ethernet card), display 1211 (e.g., CRT or LCD), input device 1212 (e.g., keyboard), and cursor control.

According to one embodiment of the invention, computer system 1200 performs specific operations by processor 1207 executing one or more sequences of one or more instructions contained in system memory 1208. Such instructions may be read into system memory 1208 from another computer readable/usable medium, such as static storage device 1209 or disk drive 1210. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1207 for execution. Such a medium may take many forms, including but not limited to, non-volatile media and volatile media. Non-volatile media includes, for example, optical or magnetic disks, such as disk drive 1210. Volatile media includes dynamic memory, such as system memory 1208.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1200. According to other embodiments of the invention, two or more computer systems 1200 coupled by communication link 1215 (e.g., LAN, PTSN, or wireless network) may perform the sequence of instructions required to practice the invention in coordination with one another.

Computer system 1200 may transmit and receive messages, data, and instructions, including program, e.g., application code, through communication link 1215 and communication interface 1214. Received program code may be executed by processor 1207 as it is received, and/or stored in disk drive 1210, or other non-volatile storage for later execution. Computer system 1200 may communicate through a data interface 1233 to a database 1232 on an external storage device 1231.

Therefore, what has been described herein an improvement to EDA tools used to design semiconductor devices that improves the processes and results of those processes for generating test sequences. The approaches disclosed herein improves the reproducibility, reliability, and results using machine learning models according to the embodiments disclosed.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computing system, comprising:
   memory having a set of instructions; and
   a processor that executes the set of instructions to implement an electronic design system, the electronic design system being for identifying one or more transitions for a respective design under test, the electronic design system comprising:
   a machine learning exploration unit that selects and simulates one or more actions on a design under test at the machine learning exploration unit at least by:
   processing state information using a respective machine learning model that outputs a selection of at least one action, the state information representing a then current state of the design under test in a simulator,
   applying the selected at least one action to the design under test in the simulator, and
   outputting state transition data corresponding to a change in the design under test from the then current state to a different state; and
   a state space manager that maintains state transition data, wherein the state space manager receives state transition data from the machine learning exploration unit and merges the state transition data into a state space representation.

2. The computing system of claim 1, wherein the machine learning exploration unit controls a number of iterations for respective machine learning models.

3. The computing system of claim 1, wherein state space representations comprise graphs of nodes and edges, nodes corresponding to respective states of a respective design under test and edges corresponding to one or more actions taken to transition the respective design under test from a first state to a second state.

4. The computing system of claim 3, wherein the machine learning exploration unit causes discovery of one or more new states by applying respective selections of the at least one action.

5. The computing system of claim 1, wherein the one or more actions are to be user provided commands or command sequences to be supported by a corresponding design under test.

6. The computing system of claim 1, wherein the electronic design system further comprises a test sequence generator for generating one or more test sequences based on a respective state space representation.

7. The computing system of claim 6, wherein the electronic design system further comprises a verification environment for executing at least one of the one or more test sequences generated based on the respective state space representation.

8. A non-transitory computer readable medium having stored thereon a sequence of instructions which, when executed by a processor implements an electronic design system, the electronic design system being for identifying one or more transitions for a respective device under test, the electronic design system comprising:
   a machine learning exploration unit that selects and simulates one or more actions on a design under test at the machine learning exploration unit at least by:
   processing state information using a respective machine learning model that outputs a selection of at least one action, the state information representing a then current state of the design under test in a simulator,
   applying the selected at least one action to the design under test in the simulator, and
   outputting state transition data corresponding to a change in the design under test from the then current state to a different state; and
   a state space manager that maintains state transition data, wherein the state space manager receives state transition data from the machine learning exploration unit and merges the state transition data into a state space representation.

9. The computer readable medium of claim 8, wherein the machine learning exploration unit controls a number of iterations for respective machine learning models.

10. The computer readable medium of claim 8, wherein state space representations comprise graphs of nodes and edges, nodes corresponding to respective states of a respective design under test and edges corresponding to one or more actions taken to transition the respective design under test from a first state to a second state.

11. The computer readable medium of claim 10, wherein the machine learning exploration unit causes discovery of one or more new states by applying respective selections of the at least one action.

12. The computer readable medium of claim 8, wherein the one or more actions are to be user provided commands or command sequences to be supported by a corresponding design under test.

13. The computer readable medium of claim 8, wherein the electronic design system further comprises a test sequence generator for generating one or more test sequences based on a respective state space representation.

14. The computer readable medium of claim 13, wherein the electronic design system further comprises a verification environment for executing at least one of the one or more test sequences generated based on the respective state space representation.

15. A method for providing an electronic design system, the electronic design system being for identifying one or more transitions for a respective device under test, the electronic design system comprising:
  a machine learning exploration unit that selects and simulates one or more actions on a design under test at the machine learning exploration unit at least by:
    processing state information using a respective machine learning model that outputs a selection of at least one action, the state information representing a then current state of the design under test in a simulator,
    applying the selected at least one action to the design under test in the simulator, and
    outputting state transition data corresponding to a change in the design under test from the then current state to a different state; and
  a state space manager that maintains state transition data, wherein the state space manager receives state transition data from the machine learning exploration unit and merges the state transition data into a state space representation.

16. The method of claim 15, wherein the machine learning exploration unit controls a number of iterations for respective machine learning models.

17. The method of claim 15, wherein state space representations comprise graphs of nodes and edges, nodes corresponding to respective states of a respective design under test and edges corresponding to one or more actions taken to transition the respective design under test from a first state to a second state.

18. The method of claim 15, wherein the one or more actions are to be user provided commands or command sequences to be supported by a corresponding design under test.

19. The method of claim 15, wherein the electronic design system further comprises a test sequence generator for generating one or more test sequences based on a respective state space representation.

20. The method of claim 19, wherein the electronic design system further comprises a verification environment for executing at least one of the one or more test sequences generated based on the respective state space representation.

* * * * *